(12) United States Patent
Huber

(10) Patent No.: US 11,489,525 B1
(45) Date of Patent: Nov. 1, 2022

(54) DEVICE AND METHOD FOR SYNCHRONOUS SERIAL DATA TRANSMISSION

(71) Applicant: DR. JOHANNES HEIDENHAIN GMBH, Traunreut (DE)

(72) Inventor: Manfred Huber, Palling (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 0 days.

(21) Appl. No.: 17/641,115

(22) PCT Filed: Jul. 14, 2020

(86) PCT No.: PCT/EP2020/069838
§ 371 (c)(1),
(2) Date: Mar. 8, 2022

(87) PCT Pub. No.: WO2021/047807
PCT Pub. Date: Mar. 18, 2021

(30) Foreign Application Priority Data

Sep. 13, 2019 (DE) ..................... 10 2019 213 982.5

(51) Int. Cl.
*H03K 19/0185* (2006.01)
*H03K 19/0175* (2006.01)
(52) U.S. Cl.
CPC . *H03K 19/01759* (2013.01); *H03K 19/01855* (2013.01); *H03K 19/017509* (2013.01)
(58) Field of Classification Search
CPC ..... H03K 19/01759; H03K 19/017509; H03K 19/01855
See application file for complete search history.

(56) References Cited

U.S. PATENT DOCUMENTS

| 6,236,693 | B1 * | 5/2001 | Haulin | .................. H04L 7/0008 |
| | | | | 327/365 |
| 6,281,715 | B1 * | 8/2001 | DeClue | .......... H03K 19/018528 |
| | | | | 327/108 |

(Continued)

FOREIGN PATENT DOCUMENTS

| DE | 19919140 A1 | 11/1999 |
| EP | 0171579 A1 | 2/1986 |

(Continued)

*Primary Examiner* — Kurtis R Bahr
(74) *Attorney, Agent, or Firm* — Leydig, Voit & Mayer, Ltd.

(57) ABSTRACT

A device for synchronous serial data transmission over a differential data channel and a differential clock channel includes an interface controller having a clock generator, data controller, clock transmitter block and data receiver block. The clock generator generates a transmit clock signal which, during a data transmission cycle, includes a clock pulse train having a period. The clock generator is suitably configured such that, for data transmission cycles in a dynamic operating state in which a maximum occurring differential voltage of a differential clock signal is lower than a maximum differential voltage of the clock transmitter block, the clock generator sets a duration of a first clock phase of a first clock period of the clock pulse train to be longer than a first clock phase of following clock periods and shorter than a time duration required to reach the maximum differential voltage.

11 Claims, 4 Drawing Sheets

(56) References Cited

U.S. PATENT DOCUMENTS

2014/0173391 A1* 6/2014 Hahn ................... H04L 25/45
                                                   327/202
2020/0304281 A1* 9/2020 Takahashi ............. H04L 7/0079

FOREIGN PATENT DOCUMENTS

| EP | 0660209 A1 | 6/1995 |
|----|------------|--------|
| WO | WO 9635159 A1 | 11/1996 |
| WO | WO 2013020529 A1 | 2/2013 |
| WO | WO 2017183508 A1 | 10/2017 |

* cited by examiner

DEVICE AND METHOD FOR SYNCHRONOUS SERIAL DATA TRANSMISSION

CROSS REFERENCE TO RELATED APPLICATIONS

This application is a U.S. National Phase application under 35 U.S.C. § 371 of International Application No. PCT/EP2020/069838, filed on Jul. 14, 2020, and claims benefit to German Patent Application No. DE 10 2019 213 982.5, filed on Sep. 13, 2019. The International Application was published in German on Mar. 18, 2021 as WO 2021/047807 A1 under PCT Article 21(2).

FIELD

The present invention relates to a device and a method for synchronous serial data transmission. The invention also relates to subsequent electronics. It is particularly advantageous for applications in automation technology because in such applications, data often needs to be transmitted over long lines.

BACKGROUND

In automation technology, it is common to use measuring devices which provide digital measurement values. In the field of numerical control systems, which are used, for example, to control machine tools, this applies particularly to position-measuring devices for measuring linear or rotary movements. Position-measuring devices which generate digital (absolute) measurement values are referred to as absolute position-measuring devices.

The transmission of absolute position values and other data is primarily accomplished using serial data interfaces because these make do with only a few data-transmission lines and nevertheless have high data transfer rates. Since data transmission usually takes place over long cable lengths, the interface signals are transmitted differentially, for example, according to the RS-485 standard. For this purpose, at the transmitter end, single-ended digital signals are converted into differential signals and output by means of special driver blocks, and, at the receiver end, the transmitted signals are converted back in receiver blocks for further processing. The transmission takes place via line pairs whose wires are twisted together.

The so-called synchronous serial interfaces, which have a unidirectionally or bidirectionally operated data line pair and a clock line pair, are especially advantageous. The transmission of data packets via the data line pair is performed in synchronism with a clock signal on the clock line pair. A large number of such digital standard interfaces have found widespread use in automation technology. Popular examples of synchronous serial interfaces include the EnDat interface of the Applicant, another is known under the same of SSI.

The SSI interface is described in EP 0 171 579 A1. It is a synchronous serial data interface having a unidirectionally operated data line pair and a unidirectionally operated clock line pair. Here, position values are read from a position-measuring device in synchronism with a clock signal that is transmitted via the clock line pair.

On the other hand, EP 0 660 209 A1 describes the basics of the Applicant's EnDat interface. This is also a synchronous serial interface which, however, has a bidirectionally operated data line pair in addition to the unidirectionally operated clock line pair. This makes it possible to transmit data in both directions—from subsequent electronics (e.g., a numerical controller) to the position-measuring device and from the position-measuring device to the subsequent electronics. Here, too, data transmission is performed in synchronism with a clock signal.

The line pairs used for transmission have, in addition to ohmic resistance, both capacitive and inductive properties, which are dependent on the length of the line. In transmission technology, one speaks of capacitance per unit length and inductance per unit length of the line in this context. The resulting charge transfer processes during data transmission lead to deformation of the transmitted signals. Therefore, given a constant data rate, the maximum cable length achievable for reliable transmission is determined by the ability of the differential receivers at the receiver end to restore the originally transmitted digital signal from the received signals.

SUMMARY

In an embodiment, the present disclosure provides a device for synchronous serial data transmission over a differential data channel and a differential clock channel. The device includes an interface controller having a clock generator and a data controller, as well as a clock transmitter block and a data receiver block. The clock generator is capable of generating a transmit clock signal which, during a data transmission cycle, includes a clock pulse train having a period. The transmit clock signal is fed to the clock transmitter block, which converts the transmit clock signal into a differential clock signal for output via the differential clock channel. A differential data signal arriving via the differential data channel is fed to the data receiver block, which converts the differential data signal into a data signal and feeds the data signal to the data controller. The transmit clock signal is fed to the data controller to synchronize reading of the data signal. The clock generator is suitably configured such that, for data transmission cycles in a dynamic operating state in which a maximum occurring differential voltage of the differential clock signal is lower than a maximum differential voltage of the clock transmitter block, the clock generator sets a duration of a first clock phase of a first clock period of the clock pulse train to be longer than a first clock phase of following clock periods and shorter than a time duration required to reach the maximum differential voltage.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
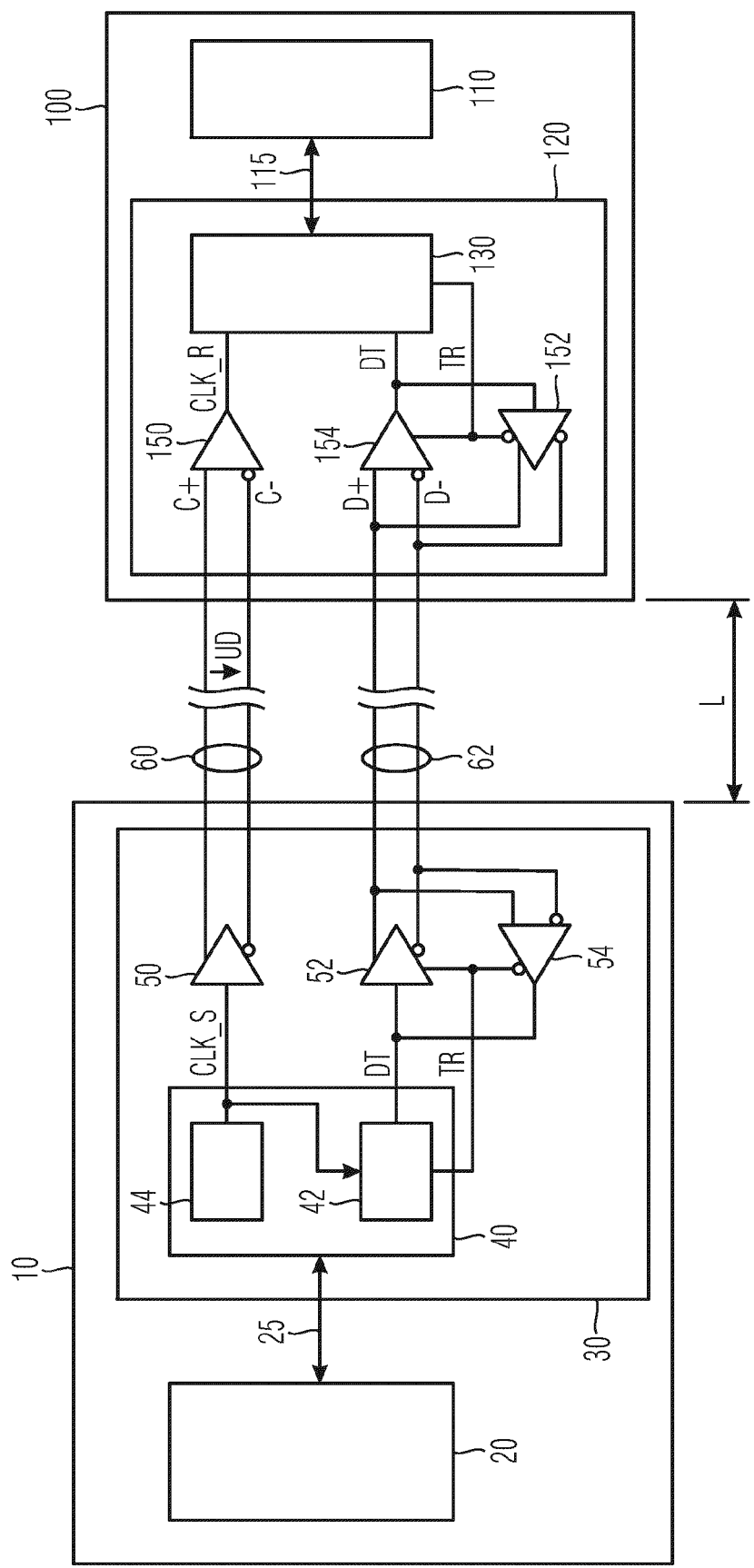
FIG. 1 is a block diagram of a device according to an embodiment of the present invention in subsequent electronics.

In an embodiment, the present invention provides a device for increasing the maximum line length for synchronous serial interfaces.

In an embodiment, the present invention provides a device for synchronous serial data transmission over a differential data channel and a differential clock channel, the device including an interface controller having a clock generator and a data controller, as well as a clock transmitter block and a data receiver block, wherein:
the clock generator is capable of generating a transmit clock signal which, during a data transmission cycle, includes a clock pulse train having a period,
the transmit clock signal is fed to the clock transmitter block, which converts it into a differential clock signal for output via the clock channel,
a differential data signal arriving via the differential data channel is fed to the data receiver block, which converts it into a data signal and feeds it to the data controller, and
the transmit clock signal is fed to the data controller to synchronize the reading of the data signal.

In accordance with an embodiment of the present invention, the clock generator is suitably configured such that, for data transmission cycles in a dynamic operating state in which the maximum occurring differential voltage of the differential clock signal is lower than the maximum differential voltage of the clock transmitter block, the clock generator sets the duration of the first clock phase of the first clock period of the clock pulse train to be longer than the first clock phase of the following clock periods and shorter than a time duration required to reach the maximum differential voltage.

In an embodiment, the present invention provides a method for increasing the maximum line length for synchronous serial interfaces.

In an embodiment, the present invention provides a method for synchronous serial data transmission over a differential data channel and a differential clock channel using a device, the device including an interface controller having a clock generator and a data controller, as well as a clock transmitter block and a data receiver block, wherein:
the clock generator generates a transmit clock signal which, during a data transmission cycle, includes a clock pulse train having a period,
the transmit clock signal is fed to the clock transmitter block, which converts it into a differential clock signal for output via the clock channel,
a differential data signal arriving via the differential data channel is fed to the data receiver block, which converts it into a data signal and feeds it to the data controller, and
the transmit clock signal is fed to the data controller to synchronize the reading of the data signal.

In accordance with an embodiment of the present invention, clock generator (44) is suitably configured such that, for data transmission cycles in a dynamic operating state (DYN) in which the maximum occurring differential voltage of the differential clock signal (C+, C−) is lower than the maximum differential voltage (UDmax) of clock transmitter block (50), clock generator (44) sets the duration of the first clock phase (TH1) of the first clock period (T1) of clock pulse train (TP) to be longer than the first clock phase (TH) of the following clock periods and shorter than a time duration required to reach the maximum differential voltage (UDmax).

FIG. 1 shows a block diagram of subsequent electronics 10 connected for data transmission purposes to a position-measuring device 100 by means of an interface connection including a clock channel 60 and a data channel 62. Subsequent electronics 10 is provided with a master interface 30 which forms a device according to an embodiment of the present invention and which communicates with a slave interface 120 of position-measuring device 100. Master interface 30 is configured as a synchronous serial interface with differential signal transmission, for example according to the RS-485 standard. Accordingly, clock channel 60 and data channel 62 each have one line pair.

Subsequent electronics 10 is a device used in automation technology, such as a numerical machine tool controller, a manufacturing robot controller, a position indicator, or any other equipment controller. It includes a program-controlled central control unit 20 in the form of a computer. Thus, it includes at least one microprocessor or microcontroller, memory units and may include various other interfaces, for example for connection of peripheral devices (keyboard, mouse, monitor, etc.). Control unit 20 may be associated with power units, for example for controlling electric motors. In addition to the depicted master interface 30, further master interfaces according to an embodiment of the present invention may of course be provided for connection of additional position-measuring devices.

Position-measuring device 100 may be configured as a rotary encoder, angle-measuring device, length-measuring device, measurement probe or other position measuring device that generates absolute position values. It has a position-sensing unit 110 suitably configured to generate position-dependent signals by scanning a measuring graduation with a scanning device, to determine absolute position values therefrom, and to transmit the same to subsequent electronics 10 via slave interface 120 upon request from master interface 30. In addition, position-measuring device 100 may be provided with memories in which additional data can be stored. The transmission of additional data from and to subsequent electronics 10 may also take place via slave interface 120.

Master interface 30 includes an interface controller 40 having a clock generator 44 and a data controller 42, as well as a clock transmitter block 50, an (optional) data transmitter block 52, and a data receiver block 54.

Interface controller 40 of master interface 30 is connected to control unit 20 via an internal interface 25. Internal interface 25 allows communication between control unit 20 and interface controller 40. For example, commands and possibly data to be sent from control unit 20 to position-measuring device 100 can be transmitted to interface controller 40. Data arriving at master interface 30 from position-measuring device 100 can be forwarded by interface controller 40 via internal interface 25 to control unit 20 for further processing. The communication of master interface 30 via clock channel 60 and data channel 62 is thus controlled by control unit 20 via internal interface 25.

Clock generator 44 generates a transmit clock signal CLK_S, which is transmitted to position-measuring device 100 on the one hand and is fed to data controller 42 on the other hand. Between two data transmission cycles, transmit clock signal CLK_S has a constant level, while during a data transmission cycle, clock generator 44 outputs a clock pulse train via transmit clock signal CLK_S.

Data controller 42 is suitably configured, on the one hand, to transmit commands and possibly data to position-measuring device 100 and, on the other hand, to receive data from position-measuring device 100. The outputting and the reading of bidirectional data signal DT is performed serially and in synchronism with transmit clock signal CLK_S.

In order for transmit clock signal CLK_S to be transmitted via clock channel 60, transmit clock signal CLK_S is fed to a clock transmitter block 50, which converts the single-ended signal into a differential clock signal composed of a non-inverted clock signal C+ and an inverted clock signal C−. Such a block is also referred to as a differential driver.

In order for the (also single-ended) data signal DT to be output, it is fed to a data transmitter block 52, which generates therefrom a differential data signal including a non-inverted data signal D+ and an inverted data signal D−. For data reception, differential data signal D+, D− is fed to a data receiver block 54 (differential receiver), which generates therefrom a single-ended digital data signal DT. To avoid signal collisions, a data direction signal TR is provided with which data controller 42 switches the respective block (data receiver block 54 or data transmitter block 52) into an active or high-impedance state. In an interface protocol, it is defined when to switch which block into an active state.

In position-measuring device 100, differential clock signal C+, C− is fed to a clock receiver block 150 that converts it back into a single-ended signal which is fed as a receiver clock signal CLK_R to an interface controller 130, which corresponds to the interface controller 40 of the subsequent electronics, for purposes of synchronizing the data input or output. Differential data signal D+, D− is fed, on the one hand, to a data receiver block 154, which converts it back into a single-ended data signal DT and feeds it to interface controller 130, and, on the other hand, a data transmitter block 152 is provided which, in the opposite data direction, converts the data signal DT to be output into the differential data signal D+, D− for transmission to subsequent electronics 10. Here, too, the data direction is set by a data direction signal TR, which is switched in accordance with the interface protocol.

Data request commands arriving at slave interface 120 from subsequent electronics 10 are in turn fed via an internal interface 115 to position-sensing unit 110, which provides the requested data and forwards it to slave interface 120. Incoming data is also forwarded via internal interface 120 to position-sensing unit 110, where it is processed or stored.

Thus, the position-measuring device 100 shown is capable of performing bidirectional data transmission in accordance with EP 0 660 209 A1.

Alternatively, position-measuring device 100 may also be configured in accordance with EP 0 171 579 A1. In this case, data receiver block 154 (and the corresponding data transmitter block 52 of the subsequent electronics) can be omitted, so that data transmission is unidirectional.

In either case, clock channel 60 is unidirectional; i.e., clock signal CLK_S is transmitted from master interface 30 to slave interface 120. In accordance with the basic principle of synchronous serial data transmission, the data bits serially transmitted on data channel 62 are synchronized by the transmit clock signal CLK_S transmitted via clock channel 60. During a data transmission cycle, one data bit is transmitted or read in each clock period of the clock pulse train output via transmit clock signal CLK_S. The consequence of this for the further considerations is that only the frequency of the clock pulse train is a limiting factor for an achievable line length L between subsequent electronics 10 and position-measuring device 100, since the highest frequency that can occur in data signal DT corresponds to only half the clock frequency of transmit clock signal CLK_S. In other words, as long as the transmission paths (differential driver, line pairs, differential receiver) of transmit clock signal CLK_S and data signal DT have substantially the same characteristics, the data transmission can be assumed to be reliable if the clock pulse train of transmit clock signal CLK_S can be restored (as receiver clock signal CLK_R) at the receiver end (by position-measuring device 100).

Figure 2:
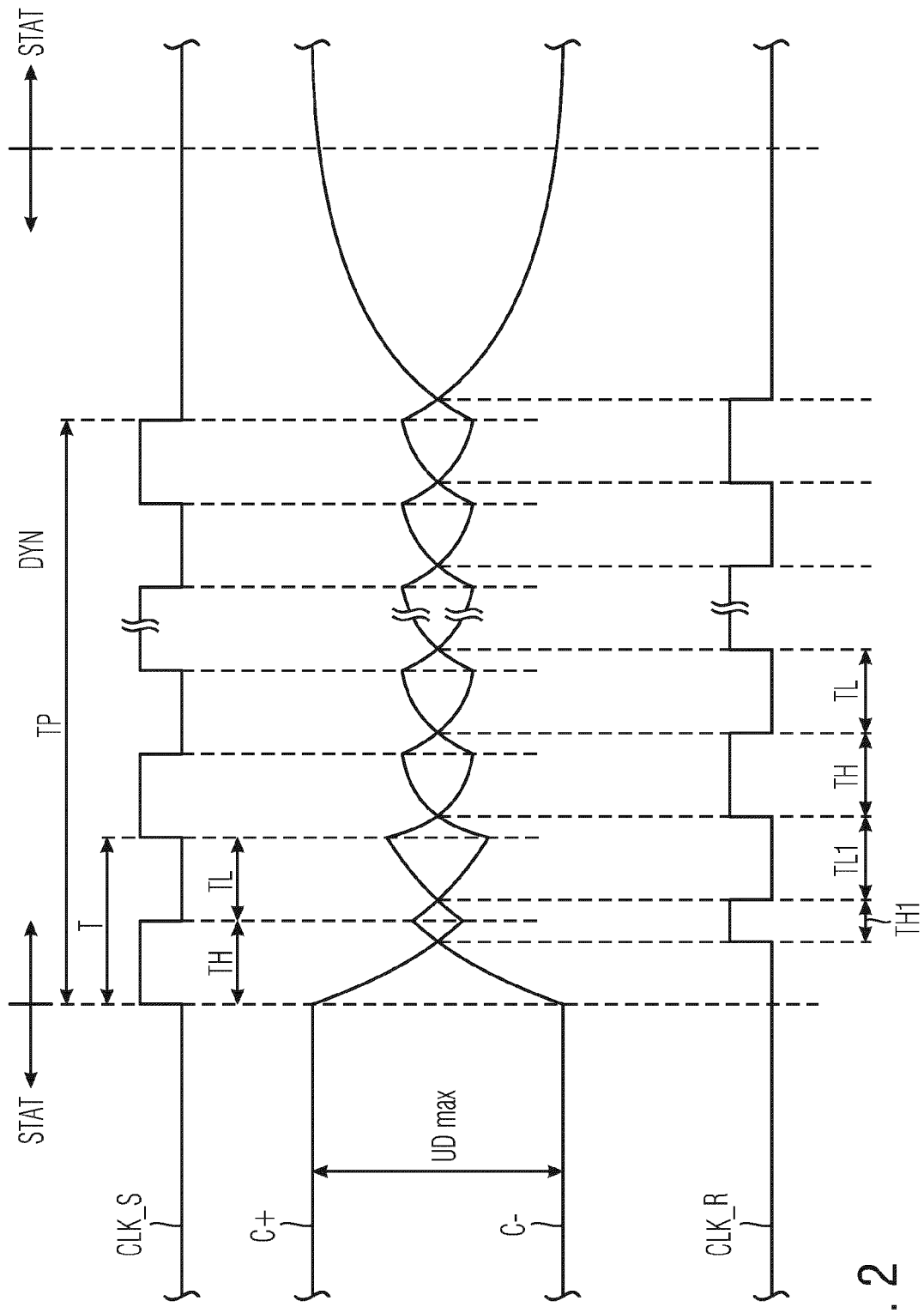
FIG. 2 is a simplified signal diagram illustrating the transmission of the transmit clock signal in the case of a long line length L according to the prior art.

FIG. 2 shows a simplified signal diagram illustrating the transmission of transmit clock signal CLK_S from subsequent electronics 10 to position-measuring device 100 in the case of a long line length L according to the prior art. The delay of the receiver clock signal CLK_R restored in position-measuring device 100 results from line length L. FIG. 2 shows the influence of the differential transmission and restoration by position-measuring device 100.

The clock pulse train of transmit clock signal CLK_S generated in a conventional clock generator for the duration of a data transmission has a constant frequency, which is determined by the period T. The clock periods are symmetric; i.e. high phase TH and low phase TL of each period are of the same length; their time duration is equal to T/2.

In times when no data transmission takes place, transmit clock signal CLK_S has a constant logic level, in the example shown a low level. As a consequence, differential clock signal C+, C− exhibits a maximum differential voltage UDmax. The receiver clock signal CLK_R restored therefrom in position-measuring device 100 also has a constant logic low level. Thus, clock channel 60 is in a static operating state STAT. In times when a clock pulse train is transmitted; i.e., when a data transmission takes place, the maximum differential voltage UDmax is no longer reached in the phases of the signal periods of the clock pulse train in the case of long line lengths L; i.e., the charge transfer processes in the line pair of clock channel 60 blend into each other. It is only after the data transmission cycle, when clock signal CLK_S assumes a static level again, that the line pair is charged to the maximum differential voltage UDmax again. From the time at which the first clock pulse is output for a data transmission until the static operating state STAT is reached again after the data transmission, clock channel 60 is in a dynamic operating state DYN.

The receiver clock signal CLK_R restored by clock receiver block 150 from non-inverted clock signal C+ and inverted clock signal C− reveals that the pulse duration of the restored first pulse (of first high phase TH1) is reduced because of the charge transfer that has to occur for the higher differential voltage during the first pulse (in the example shown the first high phase TH1) of the clock sequence of a data transmission in order to achieve a change in the level of receiver clock signal CLK_R. Moreover, the resulting smaller differential voltage at the end of the first pulse results in a slight extension of the first low phase TL1 of the restored signal; the other pulses substantially correspond to the clock pulse train of transmit clock signal CLK_S.

As a result of the shortening of first high phase TH1 of receiver clock signal CLK_R, the clock signal can no longer be correctly interpreted, so that an error occurs in the data transmission.

Figure 3:
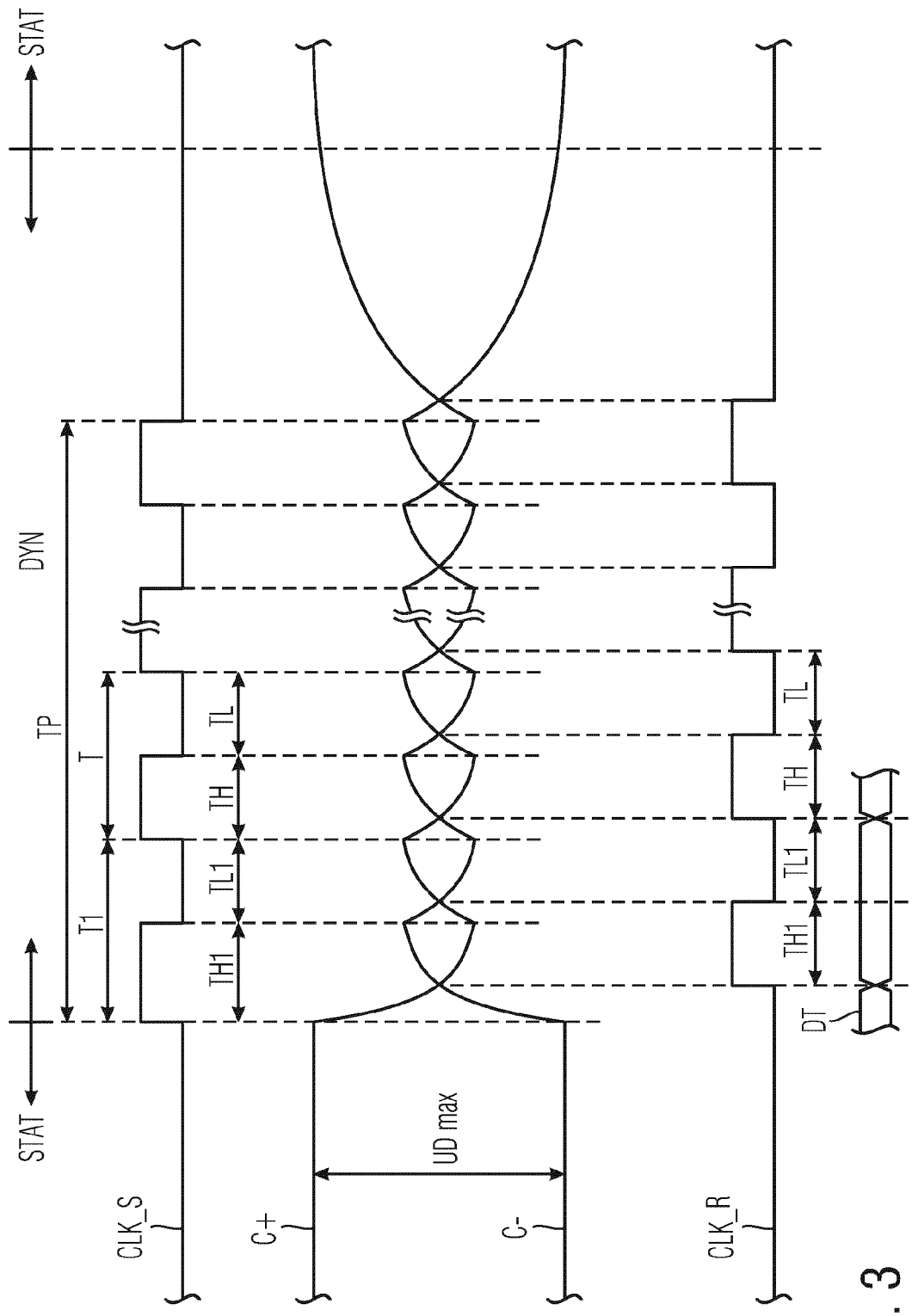
FIG. 3 is a simplified signal diagram illustrating a transmission of the transmit clock signal CLK_S in the case of a long line length L in accordance with an embodiment of the invention.

FIG. 3 shows a simplified signal diagram illustrating the transmission of a transmit clock signal CLK_S generated according to an embodiment of the present invention from subsequent electronics 10 to position-measuring device 100 in the case of a long line length L. The data transmission cycle takes place in dynamic operating state DYN; i.e., the maximum differential voltage UDmax of differential clock signal C+, C− is not reached. For purposes of generating transmit clock signal CLK_S, clock generator 44 is now configured according to an embodiment of the present invention to extend the time duration of the first clock phase of the first clock period T1 of clock pulse train TP of the data transmission cycle, in the example shown the first high phase TH1, to such an extent that the corresponding clock phase (high phase TH1) of the first clock period T1 of the restored clock pulse train can be interpreted by position-measuring device 100. On the other hand, the time duration of the first clock phase (first high phase TH1) must not be extended to the point where differential clock signal C+, C− reaches the maximum differential voltage UDmax.

This approach is based on the realization that if the frequency of clock pulse train TP of transmit clock signal CLK_S remains unchanged and line length L is increased, an error results only from the first clock phase of the clock pulse train, while all other clock phases can be correctly restored at the receiver end (i.e., by position-measuring device 100).

The transmission and reception of data signal DT, both in subsequent electronics 10 and in position-measuring device 100, continue to occur in synchronism with the associated clock edges of transmit clock signal CLK_S and receiver clock signal CLK_R, respectively. Consequently, it is not necessary to adapt data controller 42 (and possibly interface controller 130). In FIG. 3, data signal DT is therefore only schematically indicated. In the illustrated case, data signal DT is sampled at the falling edge of receiver clock signal CLK_R.

Figure 4A:
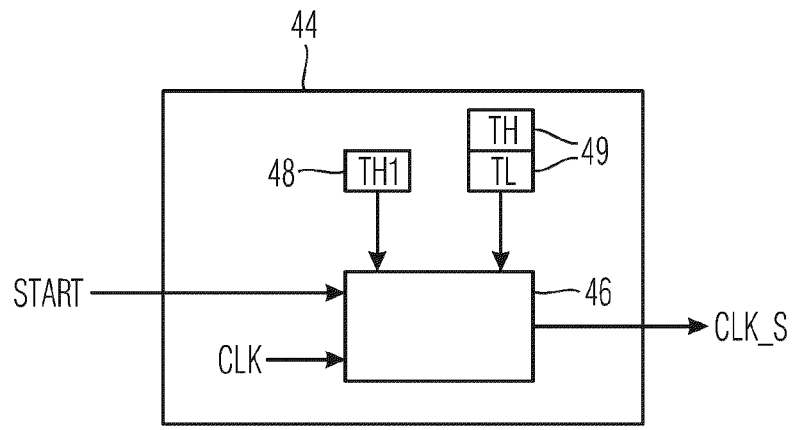
FIG. 4a is a block diagram of a first embodiment of a clock generator according to the present invention.

FIG. 4a shows a block diagram of a first embodiment of a clock generator 44 according to the invention. It has a clock output unit 46 and at least one register 48.

Clock output unit 46 is suitably configured to output transmit clock signal CLK_S. For this purpose, the duration of the first clock phase (first high phase TH1) of a clock pulse train TP is stored in register 48. In at least one additional register 49, information regarding the regular clock pulses of clock pulse train TP may be stored, such as the durations of high phase TH and low phase TL, or, in the case of a symmetrical clock signal, period T. Fed to clock output unit 46 is an operational clock signal CLK, which serves as a time base for generating clock pulse train TP, as well as a start signal START, which triggers the output of clock pulse train TP.

For purposes of generating clock pulse train TP, clock output unit 46 may, for example, be provided with a counter which counts in accordance with the time base of operational clock signal CLK and which outputs the requested logic levels for the duration of the values stored in registers 48, 49, respectively.

The value of register 48 may advantageously be written by control unit 20 of subsequent electronics 10. This allows adaptation to different line lengths L, cable specifications, frequencies of transmit clock signal CLK_S, etc.

The duration of the first clock phase can be determined by calculation, measurement or successive approximation (iteration technique).

Figure 4B:
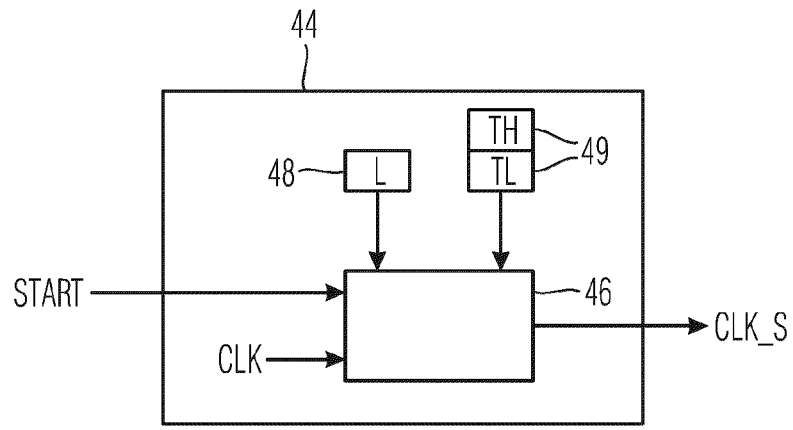
FIG. 4b is a block diagram of another embodiment of a clock generator according to the present invention.

FIG. 4b shows a block diagram of an alternative embodiment of a clock generator 44 according to the invention. Here, line length L is entered in register 48, and clock output unit 46 determines the required duration of the first clock phase by calculation or by selection from a table whose values are advantageously already determined and stored by the manufacturer. If the clock frequency of transmit clock signal CLK_S is variable, this variable clock frequency can also be taken into account, for example, by storing the duration of high phase TH and/or of low phase TL, or period T in additional registers 49 and feeding this information to clock output unit 46.

Figure 4C:
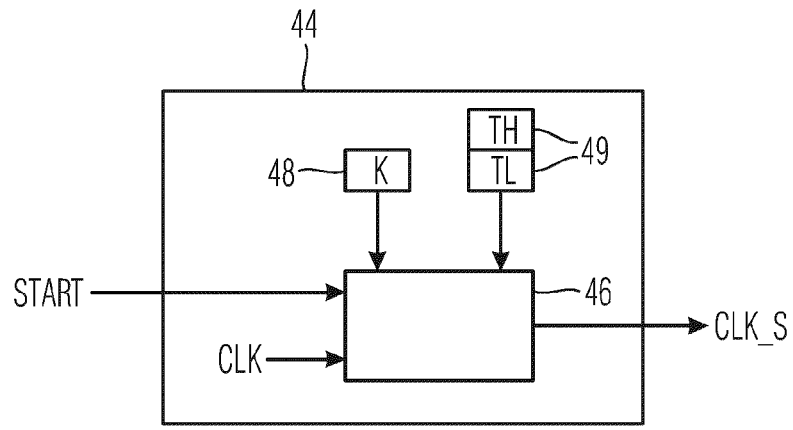
FIG. 4c is a block diagram of a further embodiment of a clock generator according to the present invention.

FIG. 4c shows a block diagram of another alternative embodiment of a clock generator 44 according to the invention. Here, only a constant K is stored in register 48, on the basis of which clock output unit 46 sets the duration of first clock phase TH1 of transmit clock signal CLK_S. This may be a multiplier that defines the amount by which first clock phase TH1 is extended, starting from a regular cycle phase TH, so that the following holds: TH1=K*TH. Constant K is selected such that error-free transmission is possible for at least one frequency of the clock pulse train TP of transmit clock signal CLK_S up to a defined maximum line length, the maximum line length being longer than the line length that is achievable with a master interface 30 without the improvement of the invention. A value that has proven suitable for the first clock phase in order to achieve a longer line length L than in the prior art is twice the duration of a regular clock phase TH of transmit clock signal CLK_S. If the first clock phase is the high phase TH1 shown in FIG. 3, then the following holds: TH1=2*TH.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A device for synchronous serial data transmission over a differential data channel and a differential clock channel, the device comprising:
    an interface controller having a clock generator and a data controller, as well as a clock transmitter block and a data receiver block, wherein:
        the clock generator is capable of generating a transmit clock signal which, during a data transmission cycle, includes a clock pulse train having a period, the transmit clock signal is fed to the clock transmitter block, which converts the transmit clock signal into a differential clock signal for output via the differential clock channel, a differential data signal arriving via the differential data channel is fed to the data receiver block, which converts the differential data signal into a data signal and feeds the data signal to the data controller, and the transmit clock signal is fed to the data controller to synchronize reading of the data signal, wherein the clock generator is suitably configured such that, for data transmission cycles in a dynamic operating state in which a maximum occurring differential voltage of the differential clock signal is lower than a maximum differential voltage of the clock transmitter block, the clock generator sets a duration of a first clock phase of a first clock period of the clock pulse train to be longer than a first clock phase of following clock periods and shorter than a time duration required to reach the maximum differential voltage.

2. The device as recited in claim 1, wherein the clock generator further comprises:

a register in which the duration of the first clock phase can be stored, at least one additional register in which information regarding regular clock pulses of the clock pulse train can be stored, and a clock output device which, in response to a start command, outputs the clock pulse train from the information stored in the registers.

3. The device as recited in claim 1, wherein the clock generator further comprises:

a register in which a line length can be stored, at least one additional register in which information regarding regular clock pulses of the clock pulse train can be stored, and a clock output unit which, based on the line length and the information regarding the regular clock pulses of the clock pulse train, determines the duration of the first clock phase and outputs the clock pulse train in response to a start command.

4. The device as recited in claim 1, wherein the clock generator further comprises:

a register in which a constant can be stored, at least one additional register in which information regarding regular clock pulses of the clock pulse train can be stored, and a clock output unit which, based on the information regarding the regular clock pulses of the clock pulse train and the constant as a multiplier, determines the duration of the first clock phase and outputs the clock pulse train in response to a start command.

5. The device as recited in claim 1, wherein the data signal is bidirectional, and the device further comprises a data transmitter block which converts the data signal to be output into a differential data signal, and wherein the data controller generates a data direction signal for setting a data direction of the differential data channel in accordance with an interface protocol.

6. A method for synchronous serial data transmission over a differential data channel and a differential clock channel using a device, the device including an interface controller having a clock generator and a data controller, as well as a clock transmitter block and a data receiver block, wherein the clock generator generates a transmit clock signal which, during a data transmission cycle, includes a clock pulse train having a period, the transmit clock signal is fed to the clock transmitter block, which converts the transmit clock signal into a differential clock signal for output via the differential clock channel, a differential data signal arriving via the differential data channel is fed to the data receiver block, which converts the differential data signal into a data signal and feeds the data signal to the data controller, and the transmit clock signal is fed to the data controller to synchronize the reading of the data signal, wherein the clock generator is suitably configured such that, for data transmission cycles in a dynamic operating state in which a maximum occurring differential voltage of the differential clock signal is lower than a maximum differential voltage of the clock transmitter block, the clock generator sets a duration of a first clock phase of a first clock period of the clock pulse train to be longer than the first clock phase of the following clock periods and shorter than a time duration required to reach the maximum differential voltage.

7. The method as recited in claim 6, wherein the clock generator further comprises:

a register in which the duration of the first clock phase is stored, at least one additional register in which information regarding the regular clock pulses of the clock pulse train is stored, and a clock output device which, in response to a start command, outputs the clock pulse train from the information stored in the registers.

8. The method as recited in claim 6, wherein the clock generator further includes a register in which a line length is stored, at least one additional register in which information regarding the regular clock pulses of the clock pulse train is stored, and a clock output unit which, based on the line length and the information regarding the regular clock pulses of the clock pulse train, determines the duration of the first clock phase and outputs the clock pulse train in response to a start command.

9. The method as recited in claim 6, wherein the clock generator further includes a register in which a constant is stored, at least one additional register in which information regarding regular clock pulses of the clock pulse train is stored, and a clock output unit which, based on the information regarding the regular clock pulses of the clock pulse train and the constant as a multiplier, determines the duration of the first clock phase and outputs the clock pulse train in response to a start command.

10. The method as recited in claim 6, wherein the data signal is bidirectional, and a data transmitter block is provided which converts the data signal to be output into a differential data signal, and a data direction signal is generated by the data controller for purposes of setting the data direction of the differential data channel in accordance with an interface protocol.

11. Subsequent electronics comprising the device according to claim 1, and a control unit connected to the interface controller of the device via an internal interface.

* * * * *